(12) United States Patent
Chen et al.

(10) Patent No.: US 10,389,100 B2
(45) Date of Patent: Aug. 20, 2019

(54) CABLE MANAGEMENT DEVICE AND COUPLING ASSEMBLY FOR RACK SYSTEM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 21 days.

(21) Appl. No.: 15/879,444

(22) Filed: Jan. 25, 2018

(65) Prior Publication Data
US 2019/0058317 A1 Feb. 21, 2019

(30) Foreign Application Priority Data
Aug. 18, 2017 (TW) .............................. 106128337 A

(51) Int. Cl.
| | | |
|---|---|---|
| H02G 3/32 | (2006.01) | |
| H05K 7/14 | (2006.01) | |
| H02G 3/04 | (2006.01) | |
| F16L 3/01 | (2006.01) | |

(52) U.S. Cl.
CPC ............ *H02G 3/32* (2013.01); *H02G 3/0437* (2013.01); *H05K 7/14* (2013.01); *H05K 7/1491* (2013.01); *F16L 3/01* (2013.01)

(58) Field of Classification Search
CPC .............................. H05K 7/1491; H02G 11/00
See application file for complete search history.

(56) References Cited

U.S. PATENT DOCUMENTS

| | | | | |
|---|---|---|---|---|
| 6,303,864 B1 * | 10/2001 | Johnson | ............... | H05K 7/1491 174/68.3 |
| 6,305,556 B1 * | 10/2001 | Mayer | ....................... | G06F 1/18 211/175 |
| 7,189,924 B1 * | 3/2007 | Popescu | ............... | H05K 7/1491 174/69 |
| 7,473,846 B2 * | 1/2009 | Doerr | ................... | H05K 7/1491 174/68.3 |
| 7,712,615 B2 * | 5/2010 | Chen | .................... | H01R 9/2416 174/69 |
| 8,231,014 B2 | 7/2012 | Chen | | |

(Continued)

FOREIGN PATENT DOCUMENTS

| | | |
|---|---|---|
| GB | 2 450 941 A | 1/2009 |
| JP | 3196759 U | 4/2015 |

*Primary Examiner* — James Wu
*Assistant Examiner* — Hung Q Dang
(74) *Attorney, Agent, or Firm* — Winston Hsu

(57) ABSTRACT

A cable management device includes a first cable management arm, a second cable management arm and an auxiliary member. The second cable management arm is movable relative to the first cable management arm. The auxiliary member can be moved with respect to one of the first cable management arm and the second cable management arm from a first position to a second position, so as to increase a length of the cable management device.

7 Claims, 9 Drawing Sheets

(56) References Cited

U.S. PATENT DOCUMENTS

| | | |
|---|---|---|
| 8,251,321 B2 | 8/2012 | Chen |
| 8,379,410 B2 | 2/2013 | Kitten |
| 9,072,190 B2 | 6/2015 | Chen |
| 9,144,174 B2 | 9/2015 | Chen |
| 9,383,038 B2 | 7/2016 | Chen |
| 9,640,961 B2 | 5/2017 | Chen |
| 9,949,400 B2 * | 4/2018 | Yi ................... H05K 7/1491 |
| 2004/0056155 A1 * | 3/2004 | Chen ................ H02G 11/00 248/49 |
| 2005/0145582 A1 * | 7/2005 | Dubon .............. H02G 3/128 211/26 |
| 2006/0113433 A1 * | 6/2006 | Chen ................ H05K 7/1491 248/70 |
| 2007/0017883 A1 | 1/2007 | Bridges |
| 2010/0193646 A1 | 8/2010 | Chen |
| 2011/0180297 A1 * | 7/2011 | Yu ................... H05K 7/1491 174/69 |
| 2014/0183306 A1 * | 7/2014 | Chen ................ H05K 7/1491 248/70 |
| 2016/0186895 A1 | 6/2016 | Chen |

\* cited by examiner

CABLE MANAGEMENT DEVICE AND COUPLING ASSEMBLY FOR RACK SYSTEM

BACKGROUND OF THE INVENTION

1. Field of the Invention

The present invention relates to a cable management device and a coupling assembly, and more particularly, to a cable management device and a coupling assembly for rack system.

2. Description of the Prior Art

As shown in FIG. 1 and FIG. 2, slide rail assemblies 102, 104 are mounted on two opposite sides of an electronic apparatus 100 in a rack system. The slide rail assemblies 102, 104 aid the electronic apparatus 100 to be mounted on a rack 106, such that the electronic apparatus 100 is able to be pulled from inside the rack 106 along a direction D, or be retracted from outside the rack 106. In general, the electronic apparatus 100 is equipped with cables. When the electronic apparatus 100 is pulled from inside the rack 106 via rails of the slide rail assemblies 102, 104 or retraced from outside the rack 106, a cable management device 108 for arranging or storing the cables is needed, so as to keep the cables neat during the electronic apparatus 100 being pulled or retracted. The conventional cable management device 108 includes at least two sections of cable management arms 108a, 108b. The cable management arms 108a, 108b are pivoted to each other to be retracted with respect to each other, as shown in FIG. 1, or to be expanded with respect to each other, as shown in FIG. 2.

However, as shown in FIG. 1, since a size of the rack 106 (or a cabinet) and/or the electronic apparatus 100 is predetermined, it causes space S behind the rack 106 or the electronic apparatus 100 to be limited in a specific scale. As a result, in order for containing the cable management arms 108a, 108b in the limited space S, a size of the cable management arms 108a, 108b is limited as well, which constrains a length of the cable management arms 108a, 108b in an expanded status.

Furthermore, when a longer length of the cable management device 108 in the expanded status is required, an additional cable management arm is used for being pivoted to one of the two sections of cable management arms 108a, 108b of the conventional cable management device 108, so that the cable management device 108 with the two sections of cable management arms 108a, 108b and the additional cable management arm is to be a cable management device with three sections of cable management arms. However, when the cable management device with three sections of cable management arms is retracted with respect to one another, a whole volume of the cable management device with three sections of cable management arms will exceed the limited space S and fail to match the rack system.

Accordingly, under the constraint on the limited space, how to develop a cable management device without occupying space and with capability of increasing an expanded length thereof has become an issue.

SUMMARY OF THE INVENTION

The present invention provides a cable management device with adjustable length thereof and a coupling assembly.

According to an embodiment of the present invention, a cable management device includes a first cable management arm, a second cable management arm and an auxiliary member. The second cable management arm is movable relative to the first cable management arm. The auxiliary member is extendable and retractable relative to one of the first cable management arm and the second cable management arm.

Preferably, the one of the first cable management arm and the second cable management arm includes a guiding feature, and the guiding feature facilitates movement of the auxiliary member.

Preferably, the cable management device further includes a first connecting member. The first connecting member is movably connected to the auxiliary member and configured to connect the cable management device with a first target object.

Preferably, the cable management device further includes a second connecting member. The second connecting member is movably connected to the other one of the first cable management arm and the second cable management arm and configured to connect the cable management device with a second target object.

Preferably, the first connecting member is pivoted to an end portion of the auxiliary member, and the second connecting member is pivoted to an end portion of the other one of the first cable management arm and the second cable management arm.

Preferably, at least one of the first cable management arm and the second cable management arm includes a cable holding feature.

Preferably, the first cable management arm and the second cable management arm are pivoted to each other.

Preferably, the cable management device further includes at least one supporting member. The at least one supporting member is configured to support one of the first cable management arm and the second cable management arm.

According to an embodiment of the present invention, a coupling assembly includes a first slide rail assembly and a first cable management device. The first slide rail assembly includes a first rail and a second rail, and the first rail and the second rail are movable relative to each other. The first cable management device includes a first cable management arm, a second cable management arm and an auxiliary member. The second cable management arm is pivotable relative to the first cable management arm. The auxiliary member is movable along a length direction of one of the first cable management arm and the second cable management arm. The auxiliary member is configured to being connected to the first rail. The other one of the first cable management arm and the second cable management arm is configured to being connected to the second rail.

Preferably, the coupling assembly further includes a second slide rail assembly and a second cable management device. The second slide rail assembly includes a third rail and a fourth rail, and the third rail and the fourth rail are movable relative to each other. The second cable management device includes a third cable management arm, a fourth cable management arm, an aiding member and a third connecting member. The fourth cable management arm is pivotable relative to the third cable management arm. The aiding member is movable along a length direction of one of the third cable management arm and the fourth cable management arm. The third connecting member is movably connected to the aiding member, and the aiding member is connected to the third rail by the third connecting member.

Preferably, the coupling assembly further includes a fourth connecting member. The fourth connecting member is movably connected to the other one of the third cable management arm and the fourth cable management arm. The other one of the third cable management arm and the fourth cable management arm is connected to the fourth rail by the fourth connecting member. The third connecting member is pivoted to an end portion of the aiding member, and the fourth connecting member is pivoted to an end portion of the other one of the third cable management arm and the fourth cable management arm.

Preferably, the auxiliary member is connected to the first rail by a first connecting bracket. The other one of the first cable management arm and the second cable management arm is connected to the second rail by a second connecting bracket. The at least one supporting member is connected to the fourth rail by a third connecting bracket. The first connecting bracket, the second connecting bracket and the third connecting bracket have a predetermined height with respect to a length direction of the first slide rail assembly.

According to another embodiment of the present invention, a cable management device includes a first cable management arm, a second cable management arm and an auxiliary member and an auxiliary member. The second cable management arm is movable relative to the first cable management arm. The auxiliary member is movable from a first position to a second position with respect to the first cable management arm, so as to increase a length of the cable management device.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
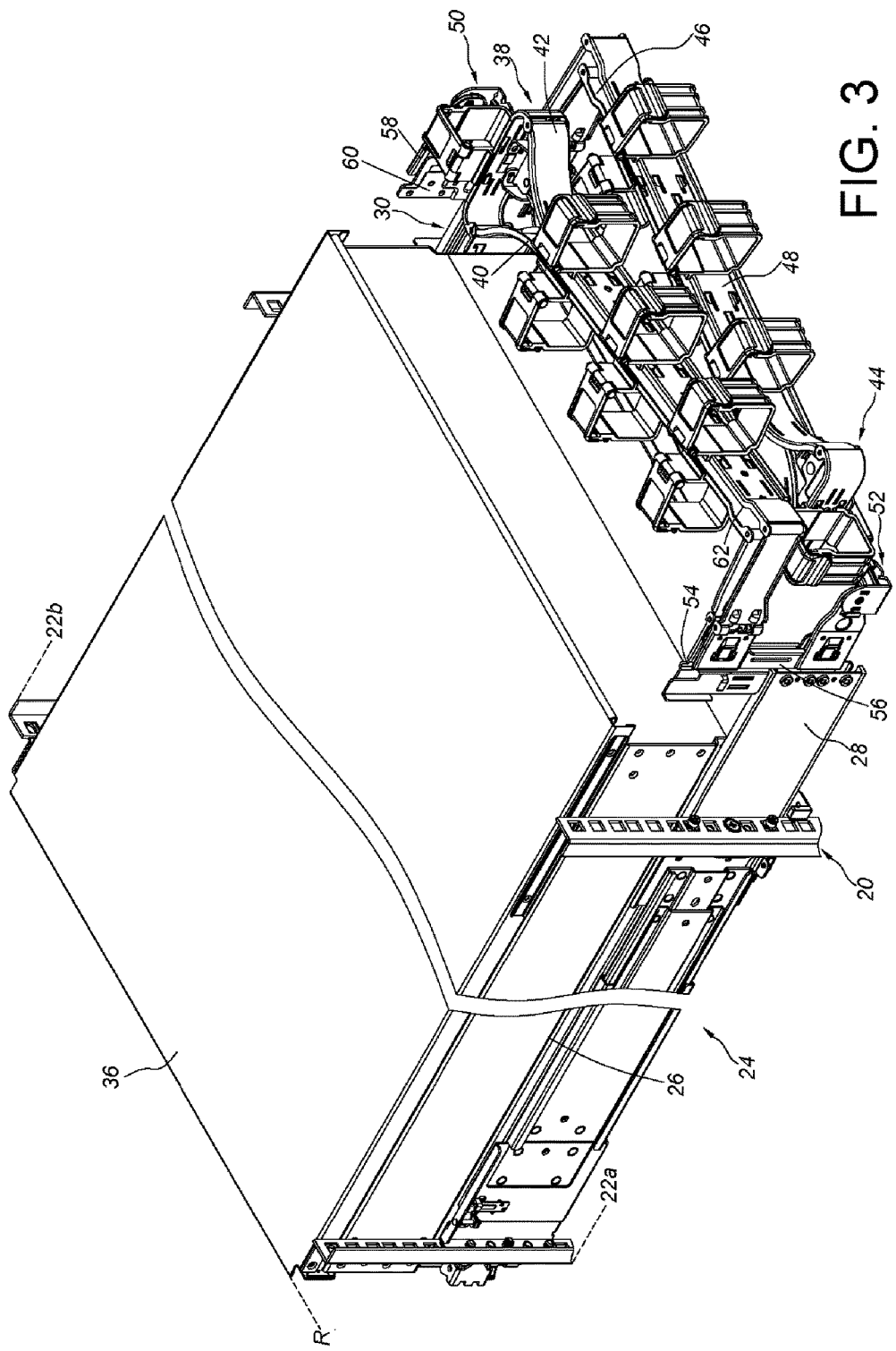
FIG. 3 is a schematic diagram of a rack system according to an embodiment of the present invention.
Figure 4:
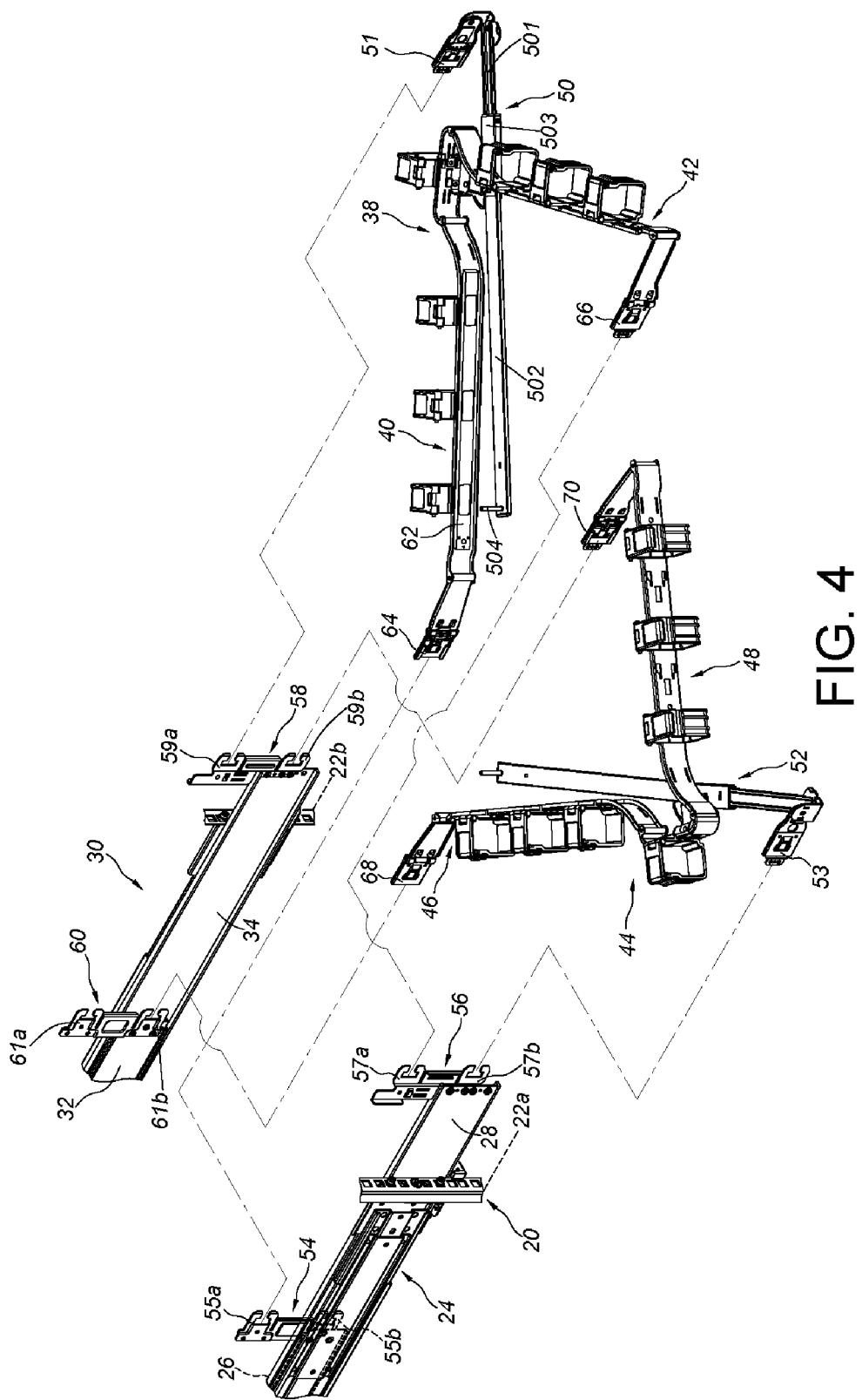
FIG. 4 is an exploded diagram illustrating two slide rail assemblies with respect to two cable management devices of the rack system according to the embodiment of the present invention.
Figure 8:
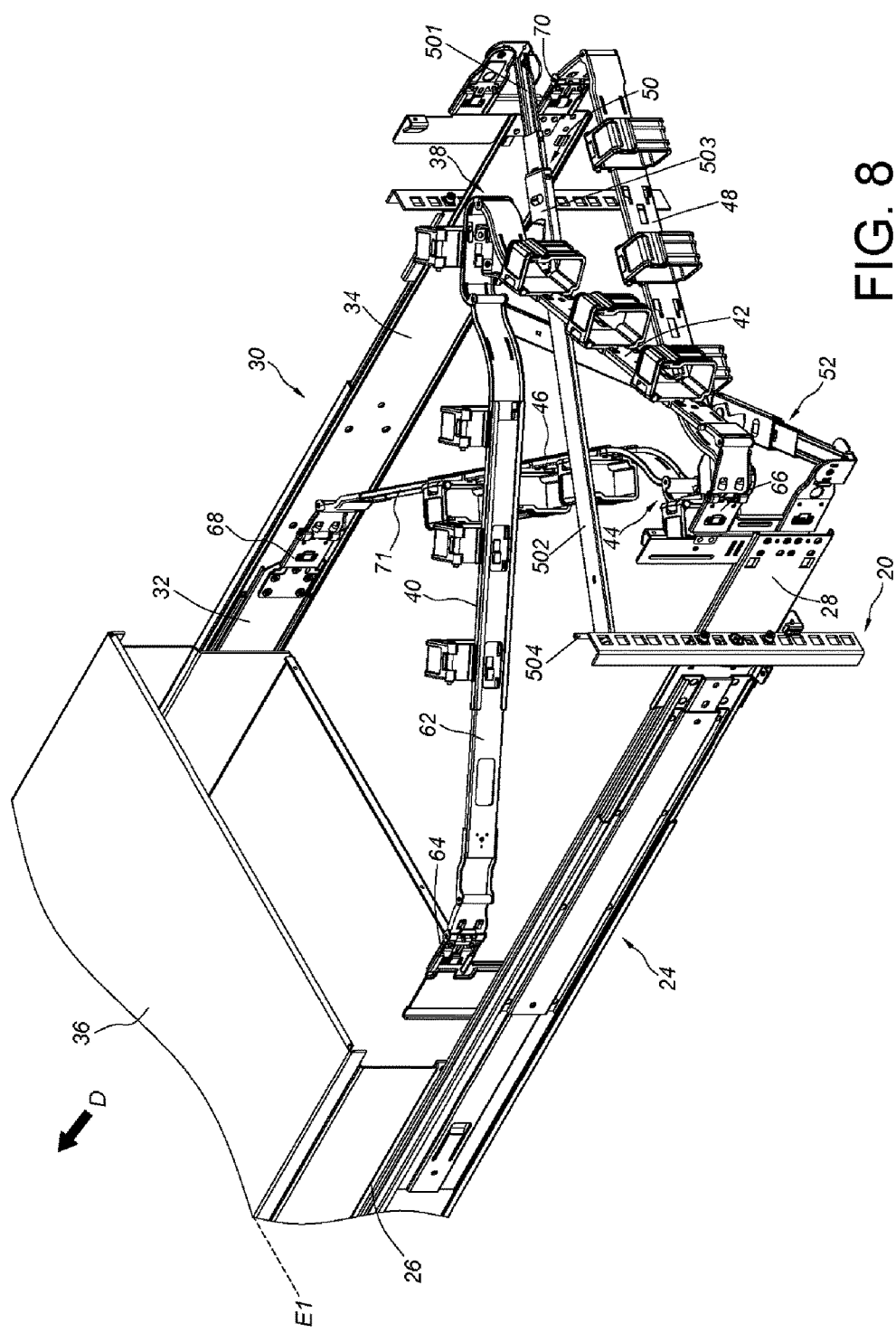
FIG. 8 is a diagram illustrating a carried object being pulled relative to a rack from a retracted position to a first expanded position according to the embodiment of the present invention.
Figure 9:
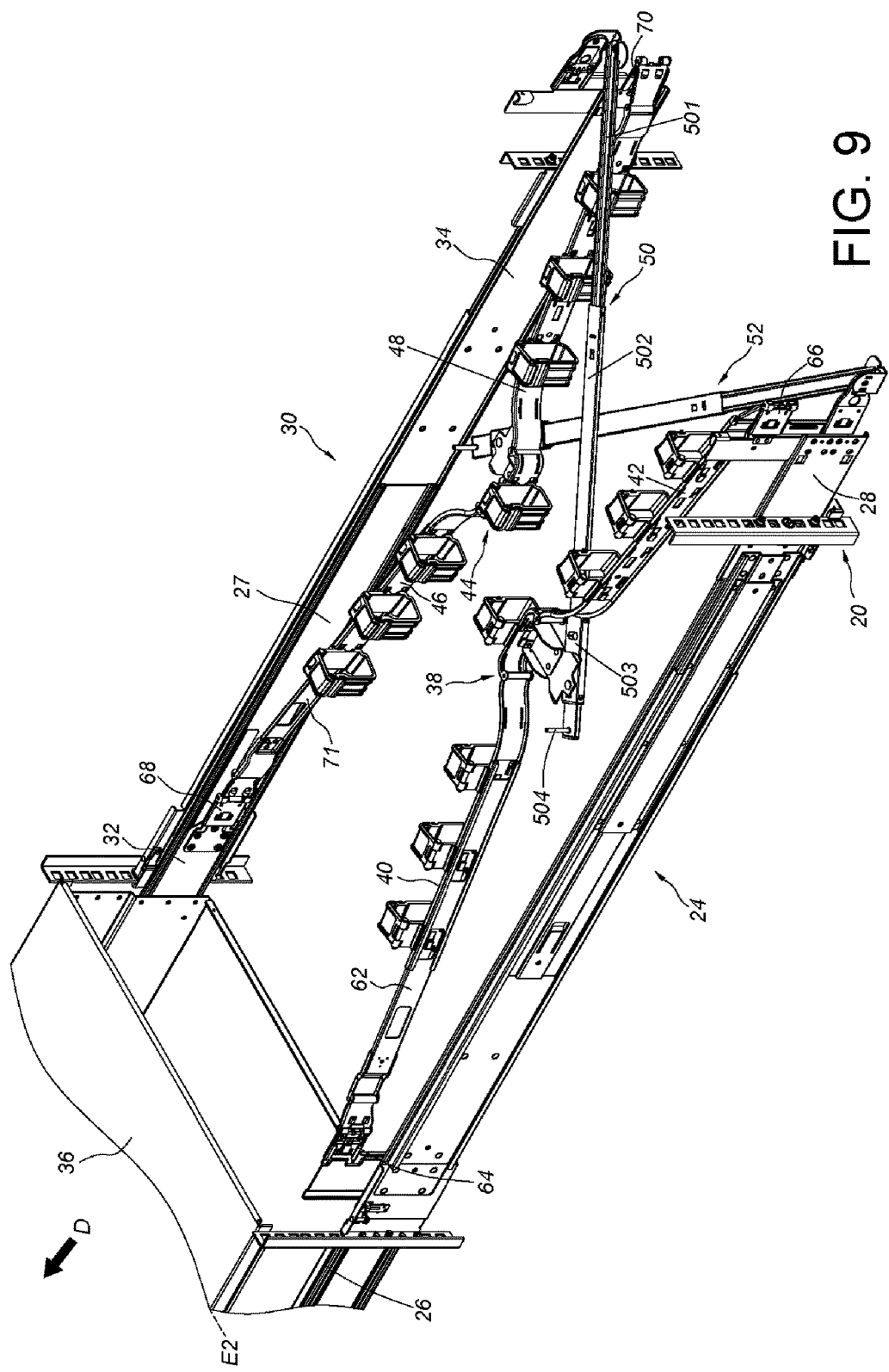
FIG. 9 is a diagram illustrating the carried object being further pulled relative to the rack to a second expanded position according to the embodiment of the present invention.

As shown in FIG. 3 and FIG. 4, a rack system in an embodiment of the present invention includes a rack 20, a first slide rail assembly 24, a second slide rail assembly 30 and a carried object 36. The rack 20 has a first side 22a and a second side 22b. The first slide rail assembly 24 is mounted to the first side 22a of the rack 20. The first slide rail assembly 24 at least includes a first rail 26 and a second rail 28. The first rail 26 and the second rail 28 are movable relative to each other. The second rail 28 being securely mounted to the first side 22a of the rack 20 and the first rail 26 being movable relative to the second rail 28 is illustrative of an example hereinafter. The second slide rail assembly 30 is mounted to the second side 22b of the rack 20, and the second slide rail assembly 30 is oriented substantially parallel to the first slide rail assembly 24. The second slide rail assembly 30 at least includes a third rail 32 and a fourth rail 34. The third rail 32 and the fourth rail 34 are movable relative to each other. The fourth rail 34 being securely mounted to the second side 22b of the rack 20 and the third rail 32 being movable relative to the fourth rail 34 is illustrative of an example hereinafter. The carried object 36 is illustrative of including a hard disk drive, a power distribution unit, and/or other electronic components. The carried object 36 is mounted between the first slide rail assembly 24 and the second slide rail assembly 30. As shown in FIG. 8 and FIG. 9, the carried object 36 is movable relative to the rack 20 from a retracted position R to an expanded position via the first rail 26 of the first slide rail assembly 24 and the third rail 32 of the second slide rail assembly 30. A first cable management device 38 includes a first cable management arm 40 and a second cable management arm 42. The second cable management arm 42 is movable relative to the first cable management arm 40. Preferably, a second cable management device 44 includes a third cable management arm 46 and a fourth cable management arm 48. The fourth cable management arm 48 is movable relative to the third cable management arm 46.

Preferably, at least one first supporting member 50 and at least one second supporting member 52 are respectively configured to support the first cable management device 38 and the second cable management device 44.

Preferably, a first connecting bracket 54 is connected to the first rail 26, a second connecting bracket 56 is connected to the second rail 28, a third connecting bracket 58 is connected to the fourth rail 34 and a fourth connecting bracket 60 is connected to the third rail 32. The aforementioned connecting brackets (i.e., the first connecting bracket 54, the second connecting bracket 56, the third connecting bracket 58 and the fourth connecting bracket 60) have a predetermined height with respect to a length direction of the first slide rail assembly 24 (or with respect to a length direction of the second slide rail assembly 30), wherein the length direction is defined by a direction along which the rail of the slide rail assembly extends or is oriented. Furthermore, the first connecting bracket 54 has an upper portion 55a and a lower portion 55b. The second connecting bracket 56 has an upper portion 57a and a lower portion 57b. The third connecting bracket 58 has an upper portion 59a and a lower portion 59b. The fourth connecting bracket 60 has an upper portion 61a and a lower portion 61b. Preferably, the aforementioned connecting brackets (i.e., the first connecting bracket 54, the second connecting bracket 56, the third connecting bracket 58 and the fourth connecting bracket 60) are respectively securely connected to the aforementioned rails (i.e., the first rail 26, the second rail 28, the fourth rail 34 and the third rail 32). Accordingly, the first connecting bracket 54 can be regarded as a portion of the first rail 26, the second connecting bracket 56 can be regarded as a portion of the second rail 28, the third connecting bracket 58 can be regarded as a portion of the fourth rail 34, and the fourth connecting bracket 60 can be regarded as a portion of the third rail 32.

Furthermore, the first cable management device 38 includes an auxiliary member 62, and the auxiliary member 62 is extendable and retractable relative to one of the first cable management arm 40 and the second cable management arm 42. The auxiliary member 62 being extendably and retractably connected to the first cable management arm 40 is illustrative of an example hereinafter, but the present invention is not limited thereto. For example, the auxiliary member 62 can be extendably and retractably connected to the second cable management arm 42 as well, and it depends on practical demands.

Preferably, the first cable management device 38 further includes a first connecting member 64. The first connecting member 64 is configured to be connected to a first target object. For example, the auxiliary member 62 is detachably connected to one of the carried object 36 and the first rail 26 of the first slide rail assembly 24 by utilizing the first connecting member 64. In the present embodiment, the auxiliary member 62 is detachably connected to the upper portion 55*a* of the first connecting bracket 54 by the first connecting member 64, such that the first cable management arm 40 is mounted to the first rail 26 and has the predetermined height relative to the first rail 26. Furthermore, the first connecting bracket 54 can be mounted on the carried object 36 as well, and the present invention is not limited thereto.

Figure 1:
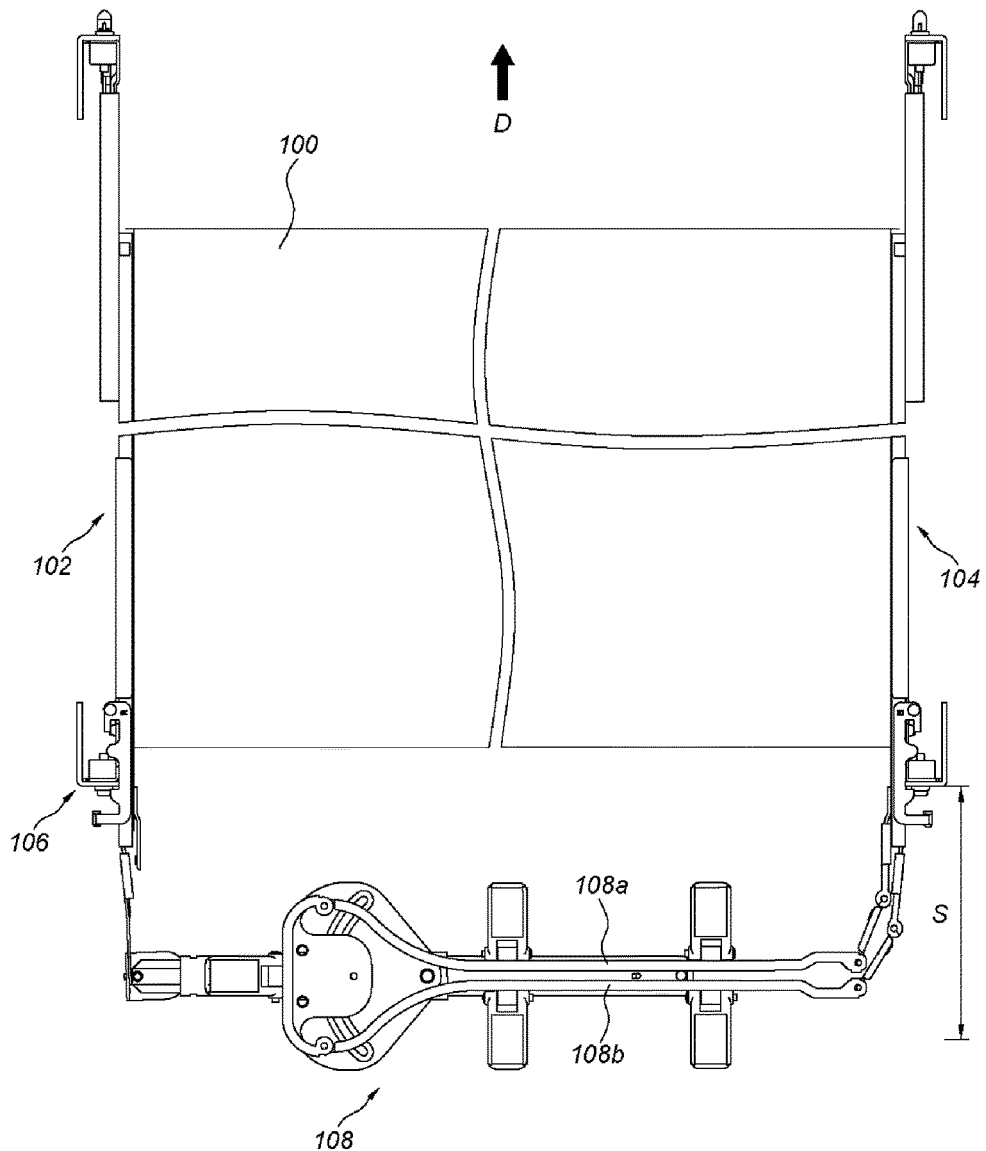
FIG. 1 is a diagram illustrating a conventional cable management device implemented in a rack system and with two cable management arms in a retracted status.
Figure 2:
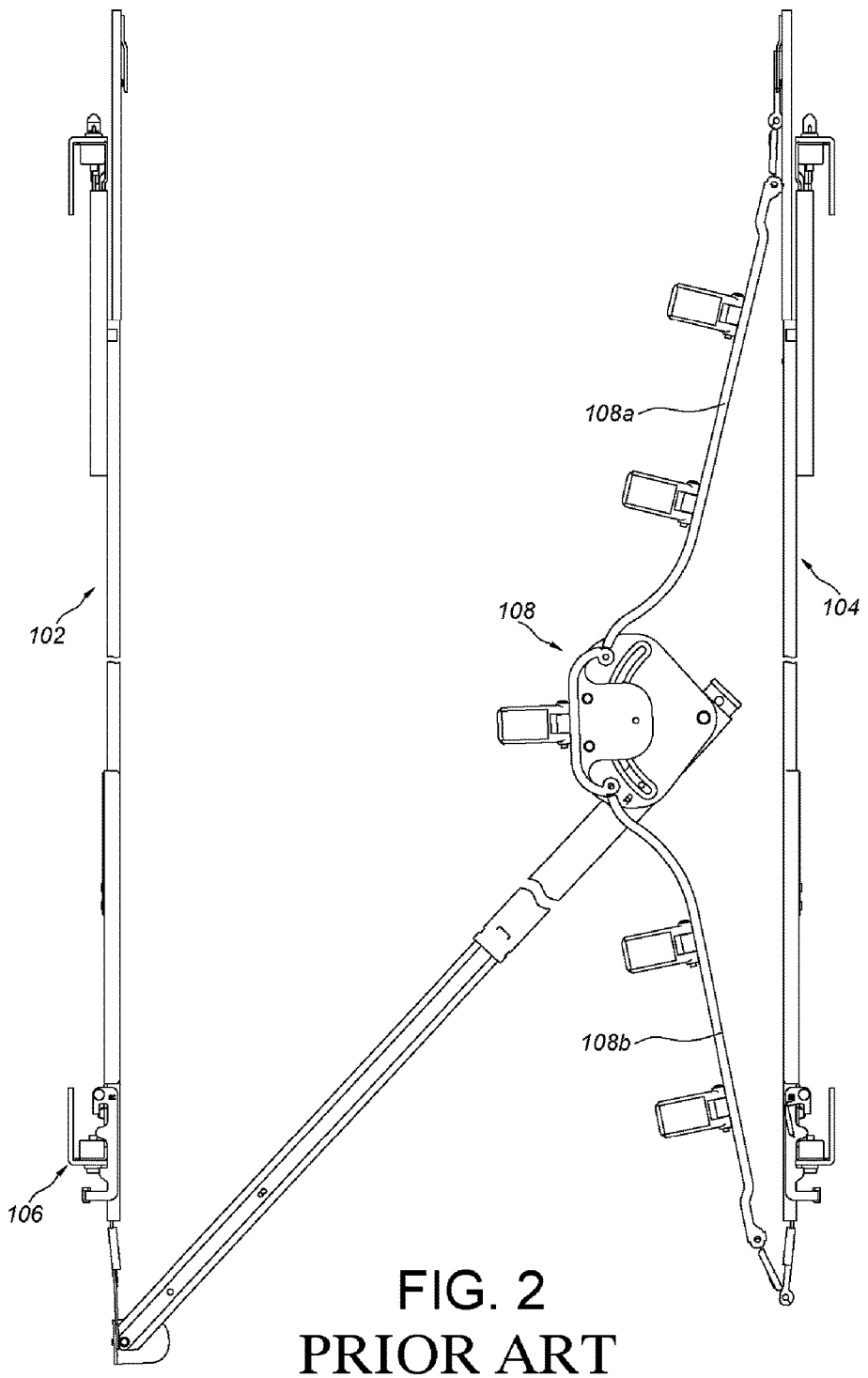
FIG. 2 is a diagram illustrating the conventional cable management device implemented in the rack system and with the two cable management arms in an expanded status.

The first cable management arm 40 and the second cable management arm 42 are moved to be expanded relative to each other, as shown in FIG. 8 and FIG. 9, or retracted relative to each other, as shown in FIG. 1. The second cable management arm 42 is connected to a second target object by a second connecting member 66. For example, the second connecting member 66 is detachably connected to one of the rack 20 and the second rail 28 of the first slide rail assembly 24. In the present embodiment, the second cable management arm 42 is detachably connected to the upper portion 57*a* of the second connecting bracket 56 by utilizing the second connecting member 66, such that the second cable management arm 42 is mounted to the second rail 28 and has the predetermined height relative to the second rail 28. Furthermore, the second connecting bracket 56 can be mounted on the rack 20, and the present invention is not limited thereto.

A first connecting portion 51 of the at least one first supporting member 50 is detachably connected to the upper portion 59*a* of the third connecting bracket 58, such that the at least one first supporting member 50 is mounted to the fourth rail 34 and has the predetermined height relative to the fourth rail 34. In the present embodiment, the at least one first supporting member 50 including two linking members extendable and retractable relative to each other is illustrative as an example.

For example, as shown in FIG. 4 to FIG. 9, the first supporting member 50 includes a first linking member 501, a second linking member 502 and a sliding base 503. An end of the first linking member 501 is pivoted to the first connecting portion 51. The second linking member 502 is extendably and retractably coupled with the first linking member 501. The sliding base 503 is slidably mounted on the second linking member 502 and pivoted to a connecting base 78, which is configured to connect the first cable management arm 40 with the second cable management arm 42. No matter when the first cable management arm 40 and the second cable management arm 42 are expanded relative to each other from a first expanded position E1 shown in FIG. 8 to a second expanded position E2 shown in FIG. 9 or when the first cable management arm 40 and the second cable management arm 42 are retracted relative to each other from the second expanded position E2 shown in FIG. 9 to the first expanded position E1 shown in FIG. 8, the sliding base 503 is driven to slide on the second linking member 502 in a longitudinal direction along which the second linking member 502 is oriented by the connecting base 78. Accordingly, the first supporting member 50 is able to utilize the sliding base 503 for supporting the first cable management device 38 during an expanded process and/or a retracted process of the first cable management arm 40 and the second cable management arm 42 and further to enhance stability of movement of the first cable management arm 40 and the second cable management arm 42 during the aforesaid expanded process and/or the retracted process.

In addition, the first supporting member 50 can include a stopping pin 504. The stopping pin 504 is disposed at an end of the second linking member 502 which is opposite to the first linking member 501. When the first cable management arm 40 and the second cable management arm 42 are expanded relative to each other to the second expanded position shown in FIG. 9, the stopping pin 504 is configured to stop the sliding base 503 for preventing the sliding base 503 from being separate from the second linking member 502.

On the other hand, the second cable management device 44 is structurally substantially identical to the first cable management device 38. For example, the second cable management device 44 includes a third connecting member 68. The third connecting member 68 is movably connected to an aiding member 71, as shown in FIG. 8 and FIG. 9. The third connecting member 68 is detachably connected to one of the carried object 36 and the third rail 32 of the second slide rail assembly 30. In the present embodiment, the third connecting member 68 is detachably connected to the lower portion 61*b* of the fourth connecting bracket 60, so as to mount the third cable management arm 46 to the third rail 32. In another embodiment, the fourth connecting bracket 60 can be mounted on the carried object 36 as well, and the present invention is not limited thereto.

The third cable management arm 46 and the fourth cable management arm 48 are moved to be expanded relative to each other, as shown in FIG. 8 and FIG. 9, or to be retracted relative to each other, as shown in FIG. 1. The fourth cable management arm 48 is detachably connected to one of the rack 20 and the fourth rail 34 of the second slide rail assembly 30 by a fourth connecting member 70. In the present embodiment, the fourth cable management arm 48 is detachably connected to the lower portion 59*b* of the third connecting bracket 58 by utilizing the fourth connecting member 70, such that the fourth cable management arm 48 is mounted to the fourth rail 34. Furthermore, the third connecting bracket 58 can be mounted on the rack 20, but the present invention is not limited thereto.

A second connecting portion 53 of the at least one second supporting member 52 is detachably connected to the lower portion 57b of the second connecting bracket 56, such that the at least one second supporting member 52 is mounted to the second rail 28. In the present embodiment, the at least one second supporting member 52 including two linking members extendable and retractable relative to each other is illustrative as an example. The structures of the second supporting member 52 are identical to those of the first supporting member 50, and detailed description is omitted herein for simplicity.

According to the abovementioned configuration, the first cable management device 38 is located above the second cable management device 44. In other words, the first cable management devices 38 and the second cable management device 44 are respectively located on an upper layer and a lower layer of the rack system and configured to arrange or contain cables behind the carried object 36, wherein the first slide rail assembly 24 and the first cable management device 38 (or the second slide rail assembly 30 and the second cable management device 44) cooperatively form a coupling assembly.

Figure 5:
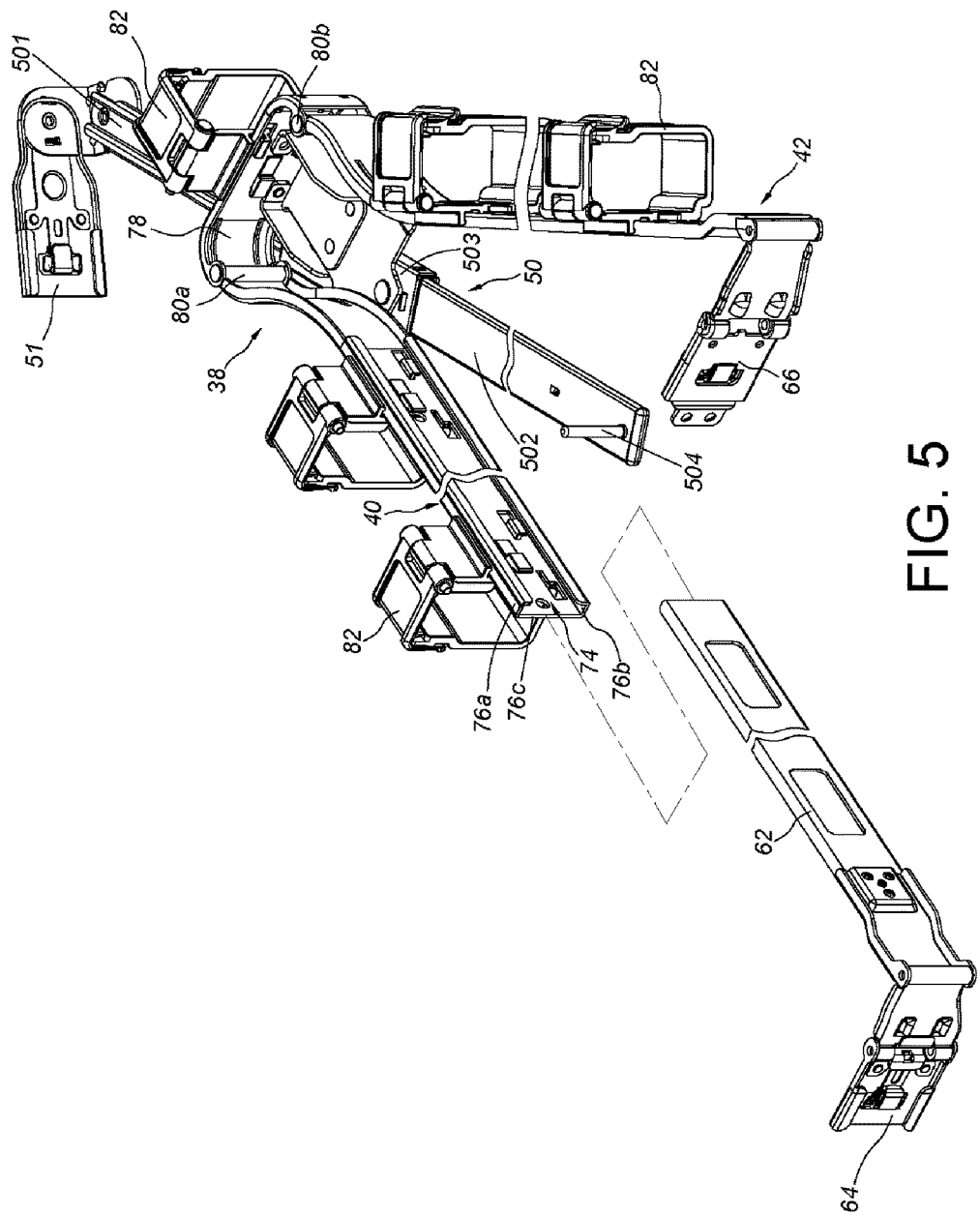
FIG. 5 is an exploded diagram of the cable management device according to the embodiment of the present invention.
Figure 6:
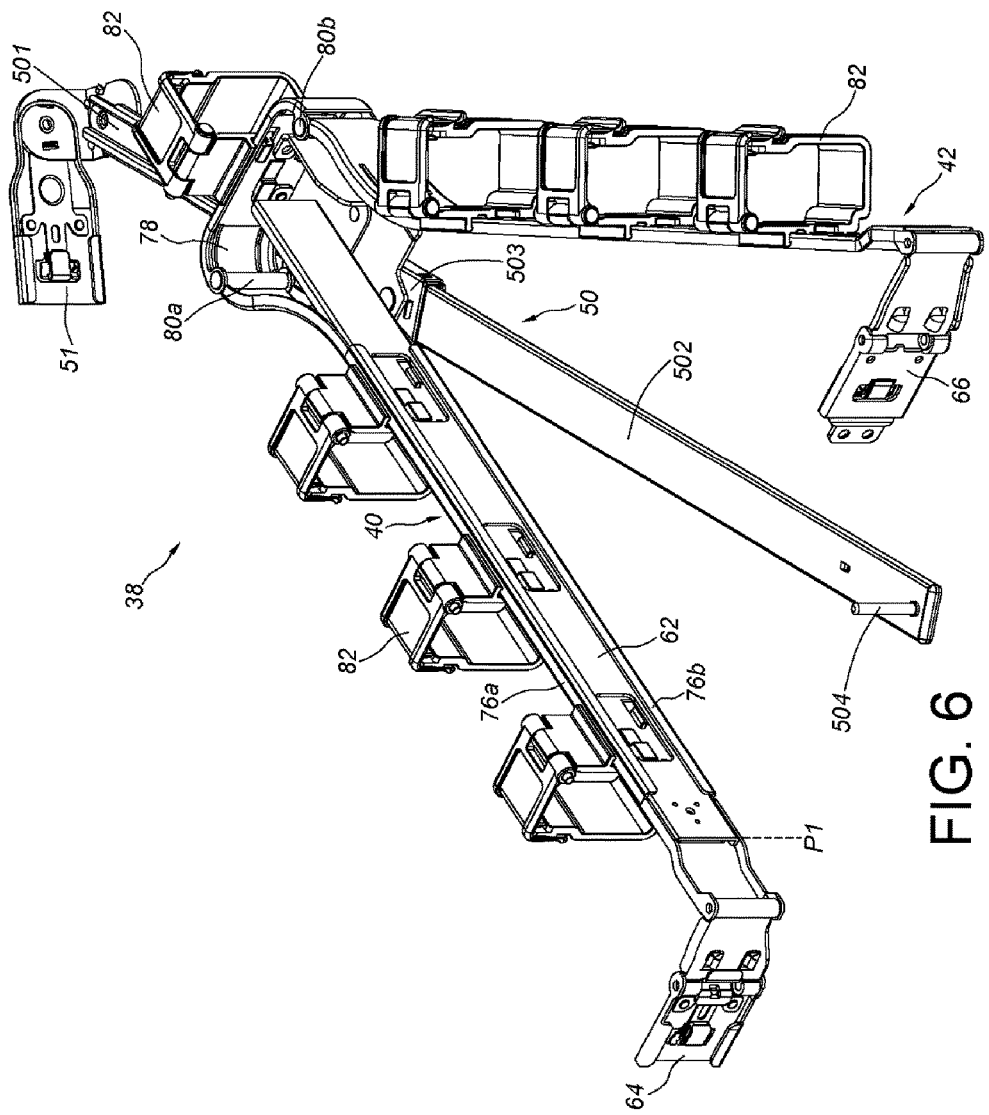
FIG. 6 is a diagram illustrating an auxiliary member of the cable management device in a retracted status with respect to a cable management arm according to the embodiment of the present invention.

As shown in FIG. 5 and FIG. 6, the first cable management arm includes a guiding feature 74. Preferably, the first cable management arm 40 includes a first wall 76a, a second wall 76b and a side wall 76c. The side wall 76c is connected between the first wall 76a and the second wall 76b, and the first wall 76a, the second wall 76b and the side wall 76c cooperatively define the guiding feature 74 as a passage. On the other hand, the auxiliary member 62 has a length, and the guiding feature 74 facilitates movement of the auxiliary member 62.

In an alternative embodiment, it should be noticed that the auxiliary member 62 is in cooperation with the first cable management arm 40 via a long hole (or a long slot) versus a protrusion, such that the auxiliary member 62 is movable relative to the first cable management arm 40, but the present invention is not limited thereto.

Preferably, the first cable management arm 40 and the second cable management arm 42 are pivoted to each other, so that the first cable management arm 40 pivots relative to the second cable management arm 42. For example, the first cable management arm 40 and the second cable management arm 42 are pivoted to each other via a connecting base 78. In practical application, the first cable management arm 40 and the second cable management arm 42 are pivoted to the connecting base 78 via two pins 80a, 80b, respectively, wherein the connecting base 78 is arranged between the first cable management arm 40 and the second cable management arm 42. Alternatively, in another embodiment, the first cable management arm 40 and the second cable management arm 42 can be pivoted to each other at ends thereof without utilizing the connecting base 78, but the present invention is not limited thereto. Preferably, the first cable management arm 40, the second cable management arm 42 and/or the connecting base 78 include(s) a cable holding feature 82. The cable holding feature 82 is configured to contain the cables of the aforesaid carried object 36.

Furthermore, the first connecting member 64 is movably connected to the auxiliary member 62, and the second connecting member 66 is movably connected to one of the first cable management arm 40 and the second cable management arm 42. For example, the second connecting member 66 is illustrative of being movably connected to the second cable management arm 42. Preferably, the first connecting member 64 is pivoted to an end portion of the auxiliary member 62, and the second connecting member 66 is pivoted to an end portion of the second cable management arm 42. On the other hand, the at least one first supporting member 50 supports a bottom portion of the first cable management device 38. Hereinafter, it is illustrative of an example that the at least one first supporting member 50 is movably configured on the bottom portion of the connecting base 78, so as to support the first cable management arm 40 and the second cable management arm 42.

Figure 7:
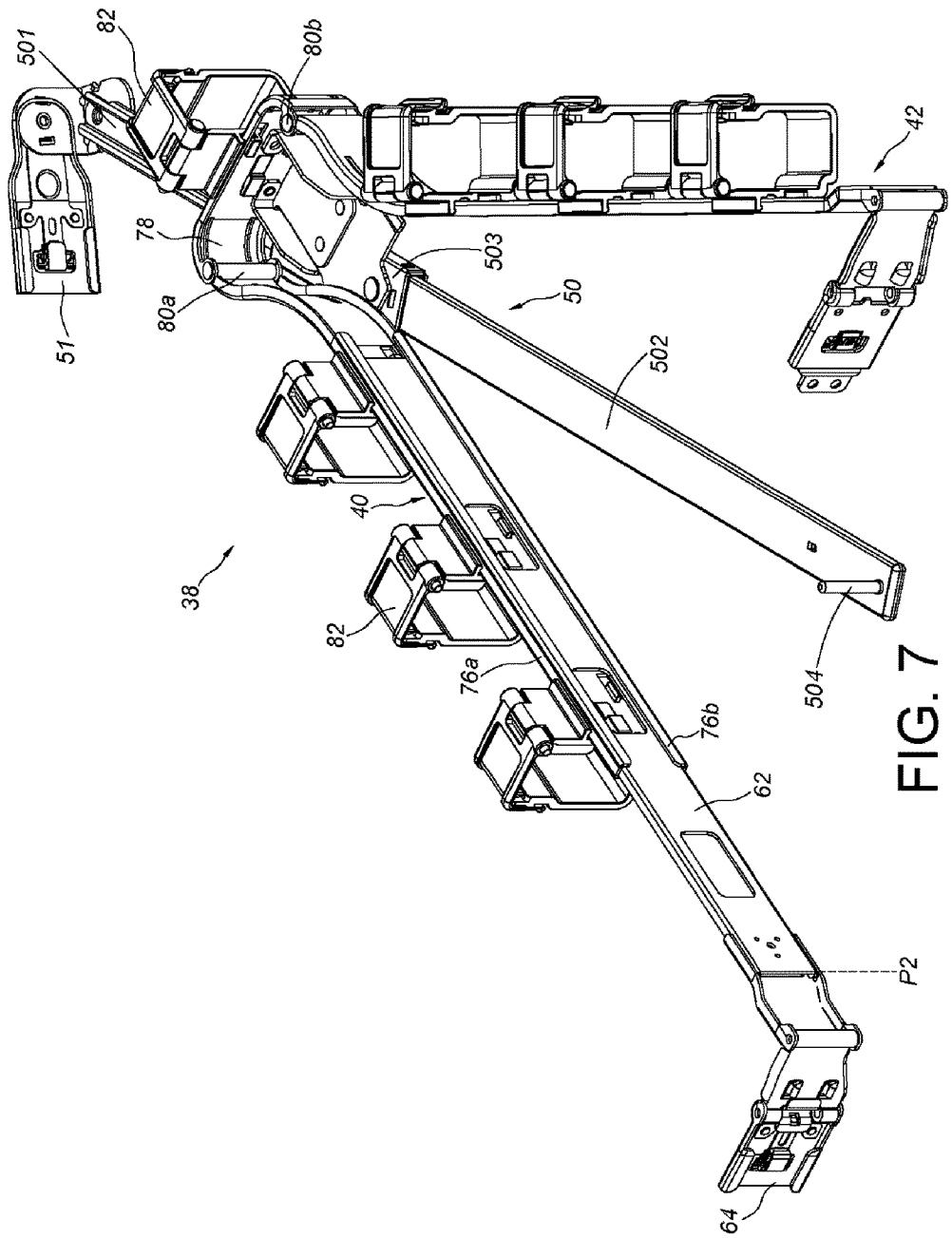
FIG. 7 is a diagram illustrating the auxiliary member of the cable management device in an expanded status with respect to the cable management arm according to the embodiment of the present invention.

As shown in FIG. 6 and FIG. 7, the auxiliary member 62 is movable along a length direction of the first cable management arm 40. In practical application, the auxiliary member 62 is able to be moved relative to the first cable management arm 40 between a first position P1 and a second position P2, so that the auxiliary member 62 is able to be in a retracted status or in an extended status relative to the first cable management arm 40. Preferably, two constraint features are utilized for allowing the auxiliary member 62 to be able to be moved only between the first position P1 and the second position P2. When the auxiliary member 62 is moved to a position e.g., the second position P2, a whole length of the first cable management device 38 can be increased.

As shown in FIG. 8, when the first rail 26 and the third rail 32 are moved relative to the second rail 28 and the fourth rail 34 from the aforesaid retracted position R to a first expanded position E1 along a direction D, the carried object 36 is moved to the first expanded position E1 relative to the rack 20 by the first rail 26 and the third rail 32 as well.

During the aforementioned process, the first cable management arm 40 and the second cable management arm 42 of the first cable management device 38 pivot to be gradually expanded relative to each other, and the auxiliary member 62 is moved to a position, e.g., the aforesaid second position P2, relative to the first cable management arm 40. Moreover, the at least one first supporting member 50 is configured to support one of the first cable management arm 40 and the second cable management arm 42. Namely, the third cable management arm 46 and the fourth cable management arm 48 of the second cable management device 44 pivot to be gradually expanded relative to each other as well, and the aiding member 71 is moved relative to the third cable management arm 46 along a length direction of the third cable management arm 46. Moreover, the at least one second supporting member 52 is configured to support one of the third cable management arm 46 and the fourth cable management arm 48.

As shown in FIG. 9, when the first rail 26 and the third rail 32 are respectively moved relative to the second rail 28 and the fourth rail 34 from the aforesaid first expanded position E1 to a second expanded position E2 along the direction D, the carried object 36 is further moved to the second expanded position E2 relative to the rack 20 by the first rail 26 and the third rail 32.

The first cable management arm 40 and the second cable management arm 42 of the first cable management device 38 pivot to be expanded relative to each other. Namely, the third cable management arm 46 and the fourth cable management arm 48 of the second cable management device 44 pivot to be expanded relative to each other as well.

Preferably, the first slide rail assembly 24 and the second slide rail assembly 30 further include a middle rail 27, respectively. The middle rail 27 is configured to enhance displacement of the first rail 26 relative to the second rail 28 as well as displacement of the third rail 32 relative to the fourth rail 34.

As mentioned above, the cable management device and the coupling assembly in the embodiment of the present invention are advantageous in the following perspective that the cable management device 38 includes the auxiliary member 62, which can be in the retracted status or in the expanded status relative to the first cable management arm 40. Furthermore, the auxiliary member 62 in the retracted status allows the cable management device 38 not to occupy space, e.g., not to occupy the space behind the slide rail assembly, the carried object or the rack, when the first cable management arm 40 and the second cable management arm 42 are retracted relative to each other. Furthermore, the auxiliary member 62 in the expanded status is able to increase the whole length of the cable management device 38 for satisfying requirement of longer displacement or other requirements related to the length.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A coupling assembly, comprising:
   a first slide rail assembly comprising a first rail and a second rail, the first rail and the second rail being movable relative to each other;
   a first cable management device, comprising:
      a first cable management arm;
      a second cable management arm pivotable relative to the first cable management arm, the first cable management arm and the second cable management arm being pivoted to each other by a connecting base; and
      an auxiliary member movable along a length direction of one of the first cable management arm and the second cable management arm;
      wherein the auxiliary member is connected to the first rail by a first connecting bracket;
      wherein the other one of the first cable management arm and the second cable management arm is connected to the second rail by a second connecting bracket;
   a second slide rail assembly comprising a third rail and a fourth rail, the third rail and the fourth rail being movable relative to each other;
   a second cable management device, comprising:
      a third cable management arm;
      a fourth cable management arm pivotable relative to the third cable management arm;
      an aiding member movable along a length direction of one of the third cable management arm and the fourth cable management arm; and
      a third connecting member movably connected to the aiding member, and the aiding member being connected to the third rail by the third connecting member; and
   at least one supporting member configured to support one of the first cable management arm and the second cable management arm, the at least one supporting member being connected to the fourth rail by a third connecting bracket;
   wherein the first slide rail assembly is configured to be mounted to a first side of a rack, and the second slide rail assembly is configured to be mounted to a second side of the rack opposite to the first side of the rack;
   wherein the first connecting bracket, the second connecting bracket and the third connecting bracket have a predetermined height with respect to a length direction of the first slide rail assembly.

2. The coupling assembly of claim 1, wherein the one of the first cable management arm and the second cable management arm comprises a guiding feature, and the guiding feature facilitates movement of the auxiliary member.

3. The coupling assembly of claim 1, further comprising:
   a first connecting member movably connected to the auxiliary member and configured to connect the auxiliary member with the first rail.

4. The coupling assembly of claim 3, further comprising:
   a second connecting member movably connected to the other one of the first cable management arm and the second cable management arm and configured to connect the other one of the first cable management arm and the second cable management arm with the second rail.

5. The coupling assembly of claim 4, wherein the first connecting member is pivoted to an end portion of the auxiliary member, and the second connecting member is pivoted to an end portion of the other one of the first cable management arm and the second cable management arm.

6. The coupling assembly of claim 1, wherein at least one of the first cable management arm and the second cable management arm comprises a cable holding feature.

7. The coupling assembly of claim 1, further comprising:
   a fourth connecting member movably connected to the other one of the third cable management arm and the fourth cable management arm, the other one of the third cable management arm and the fourth cable management arm being connected to the fourth rail by the fourth connecting member, the third connecting member being pivoted to an end portion of the aiding member, and the fourth connecting member being pivoted to an end portion of the other one of the third cable management arm and the fourth cable management arm.

* * * * *